United States Patent [19]

Kobayashi et al.

[11] 4,368,448

[45] Jan. 11, 1983

[54] WATER COOLING APPARATUS FOR ELECTRIC CIRCUIT ELEMENTS

[75] Inventors: Shigeo Kobayashi; Kazuo Kobayashi; Eiki Takahashi, all of Hitachi, Japan

[73] Assignee: Hitachi, Ltd., Tokyo, Japan

[21] Appl. No.: 166,702

[22] Filed: Jul. 3, 1980

[30] Foreign Application Priority Data

Jul. 6, 1979 [JP] Japan .................................. 54-84994

[51] Int. Cl.³ .............................................. H01F 27/10
[52] U.S. Cl. .................................. 336/61; 165/134 R; 165/180; 174/15 R; 204/197; 285/173; 336/62
[58] Field of Search ........................ 174/15 R; 307/95; 165/134 R, 180; 285/173, 174, 329, 422, DIG. 24; 204/148, 197; 336/62, 55, 58, 57, 61

[56] References Cited

U.S. PATENT DOCUMENTS

| | | | |
|---|---|---|---|
| 1,844,683 | 2/1932 | Remsheid | 285/DIG. 24 |
| 2,164,997 | 7/1939 | Machlett | 174/15 R X |
| 2,985,706 | 5/1961 | Dobry | 174/15 R X |

*Primary Examiner*—Thomas J. Kozma
*Attorney, Agent, or Firm*—Antonelli, Terry & Wands

[57] ABSTRACT

A water cooling apparatus for an electric circuit element is disclosed in which an internal waterway is connected with an external waterway by a connector with the whole body, the forward end or the inside part of the forward end thereof alone made of an alloy containing iron, nickel and/or chromium as main components. The water cooling apparatus may further comprise a net of an alloy containing iron, nickel and chromium as main components, the net being stretched in said waterway at the inside part of the forward end of the connector.

17 Claims, 13 Drawing Figures

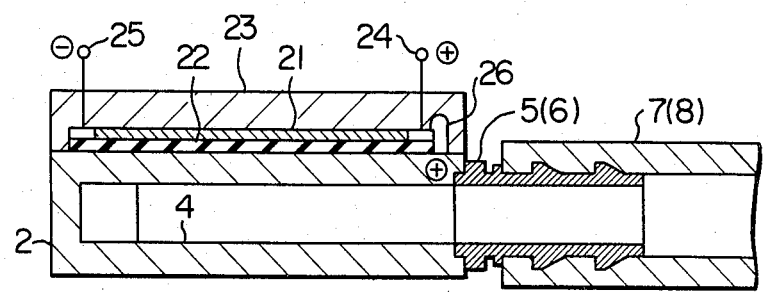
FIG. 4A
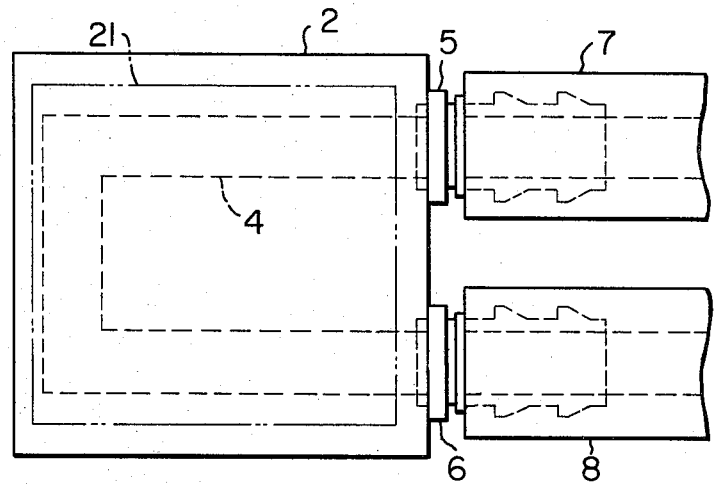
FIG. 4B
FIG. 5
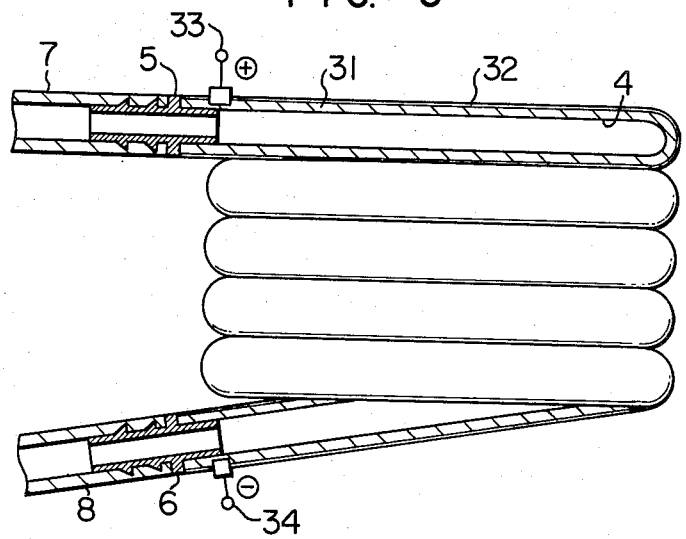

WATER COOLING APPARATUS FOR ELECTRIC CIRCUIT ELEMENTS

The present invention relates to a water cooling apparatus for electric circuit elements or more in particular to a water cooling apparatus suitable for cooling a semiconductor element, a resistor element or a reactor element impressed with a high voltage.

Generally, in cooling a semiconductor element or a resistor element with water, a method is taken by which such an element is mounted in close contact on the outer surface of a water cooling fin and is cooled by the water flowing through a water way formed in the water cooling fin.

In the case where a reactor element is cooled by use of water, on the other hand, water is made to flow through a spiral metal pipe constituting part of the reactor element, in which case the metal pipe acts as a water cooling fin at the same time.

Metals such as Au, Ag, Cu and Al high in thermal conductivity are suitable as a material of the cooling fin. Of these metals, a low-cost metal such as Cu or Al, or an alloy containing it as a main component is generally used. When such a metal immersed in water is impressed with a DC voltage, however, an electro-chemical action causes a large amount of the metal to be dissolved in the cooling water at the positive electrode side, and the same metal is deposited on the negative electrode.

In the case where these elements are connected in series, the waterways of the cooling fins are connected to each other by a water supply pipe made of an insulating material. Part of the metal ions dissolved in the cooling water is deposited on the internal side of the water supply pipe. Especially in the case where the cooling apparatus is operated for a long period of time, the insulation characteristics of the water supply pipe are deteriorated and the coefficient of friction of the wall of the water supply pipe is increased, thus increasing the friction loss of the cooling water. Also, the dissolution of the metal of the cooling fin bores a hole in the cooling fin from which water may leak out.

This disadvantage also applies to the tray for containing electric circuit elements. Specifically, an insulating hose in the tray for applying the cooling water to the electric circuit elements and an insulating hose outside of the tray are usually connected to each other by a connector of copper disposed through a tray frame. When this connector is impressed with an electric potential, a lot of copper is dissolved in the cooling water. This leads to the same disadvantage as that observed for the cooling fins mentioned above.

Accordingly, it is an object of the present invention to provide a water cooling apparatus for electric circuit elements in which very little metal is dissolved in the cooling water.

Another object of the present invention is to provide a water cooling apparatus particularly suitable for water-cooling a semiconductor element or a resistor element.

Still another object of the present invention is to provide a water cooling apparatus particularly suitable for water-cooling a reactor element.

A further object of the present invention is to provide a water cooling apparatus suitable for housing electric circuit elements received in a tray.

According to the present invention, there is provided a water cooling apparatus for electric circuit elements, in which an inner waterway and an outer waterway of the water cooling apparatus are connected by a connector, the whole body, the forward end or the inside part of the forward end of which connector is made of an alloy containing Fe, Ni and Cr as its main components (such as stainless steel or Inconel). In some cases, a net of an alloy containing Fe, Ni and Cr as its main components is additionally stretched across the waterway part in the inner portion of the forward end of the connector.

According to the present invention, it is thus possible to provide a water cooling apparatus for electric circuit elements in which very little metal is dissolved in the cooling water even at a high electric field intensity.

The above and other objects, features and advantages will be made apparent by the detailed description taken in conjunction with the accompanying drawings, in which:

FIGS. 4A and 4B show another embodiment of the present invention applied to a resistor;

FIG. 5 is a diagram showing a still another embodiment of the present invention applied to a reactor;

Figure 1:
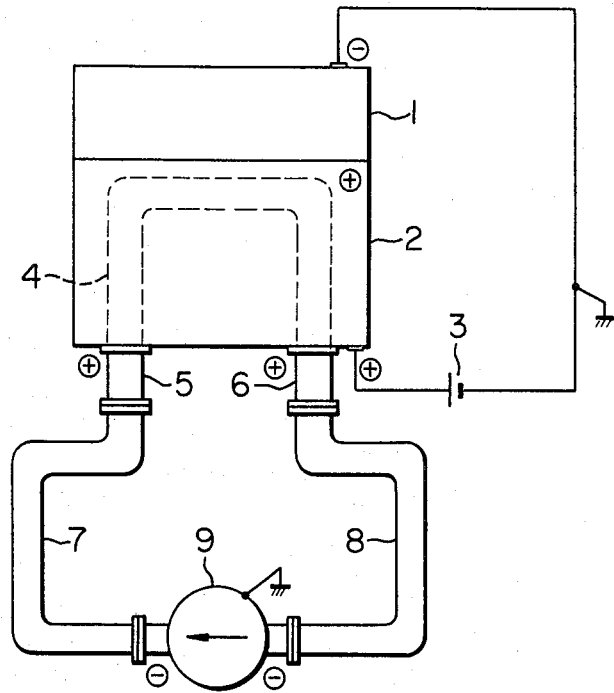
FIG. 1 is a diagram for explaining the principle of the present invention.

A diagram of explaining the principle of the present invention is shown in FIG. 1. In the drawing, an electric circuit element 1 (such as a resistor, a transistor or a thyristor) is closely attached to the outer side of a Cu water-cooling fin and the resulting assembly has ends thereof connected to the positive and negative electrodes of a DC power supply 3 respectively. A waterway 4 is formed inside the water-cooling fin 2. An end of the waterway 4 is connected through a stainless steel (SUS) connector 5 to an insulating water supply pipe 7, and the other end thereof is connected through an SUS connector 6 to an insulating water drain pipe 8. The cooling water supplied through the drain pipe 8 is supplied again into the water supply pipe 7 by a pump 9. Thus the cooling water circulates through parts 9, 7, 5, 4, 6, 8 and 9 in that order. The pump 9 is generally provided with a cooler (not shown) on the front or back side thereof so that water cooled to a predetermined temperature is always supplied to the water supply pipe 7.

In the water cooling system of FIG. 1, assuming that the voltage of the DC power supply 3 is applied across the electric circuit element 1 and the water-cooling fin 2, positive electrode sections ⊕ and negative electrode sections ⊖ as shown in the drawings are formed. As a result, the water-cooling fin 2 and the pump 9 are impressed substantially with a DC voltage, thus causing a current flow in the cooling water through the water supply pipe 7 and the water drain pipe 8. In the prior art apparatuses (which lacks the connectors 5 and 6 or which have connectors of other material than SUS), therefore, a large amount of Cu is dissolved from the water-cooling fin at the connection portion between the waterway 4 and each of the water supply pipe 7 and the water drain pipe 8, and is deposited on the pump 9.

In order to overcome this problem, the SUS connectors 5 and 6 are provided at the connections between the fin 2 and the water supply pipe 7 and between the fin 2 and the water drain pipe 8 respectively. Our experiments show that an alloy such as SUS is far less dissolved than such a metal as Cu at a high electric field intensity, and this fact has been applied to the connectors. Specifically, let the resistivity of the cooling water be p, the sectional area of the water way in each of the water supply and drain pipes be S, and the length of each of the water supply and drain pipes be l. Then the current i flowing at the voltage V impressed on the water-cooling fin is given as equation (1) below.

$$i = V \cdot S / p \cdot l \quad (1)$$

The amount W of dissolved metal is determined by the current i, the conduction time T and a constant K depending on various factors including the chemical equivalent of the metal, the surface condition of the metal, the current density in the metal surface and the oxygen content of the cooling water, and is expressed by equation (2) below.

$$W = KiT \quad (2)$$

Experiments show that the value of K with respect to Cu is greater than that with respect to Al and the value of K with respect to Al is much greater than that with respect to SUS. Namely, $K_{Cu} > K_{Al} > > K_{SUS}$. Thus, if SUS is used as a material for the connection portion between the water-cooling fin and each of the water supply and drain pipes, the amount of the dissolved metal in the cooling water is greatly reduced.

Figure 2A:
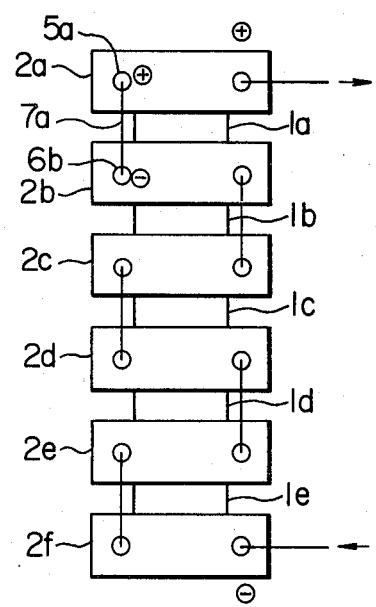
FIGS. 2A and 2B are diagrams for explaining the present invention in which electric circuit elements are connected in series.
Figure 2B:
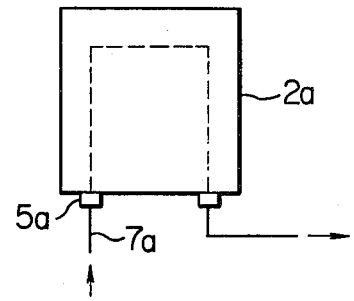
Figure 3A:
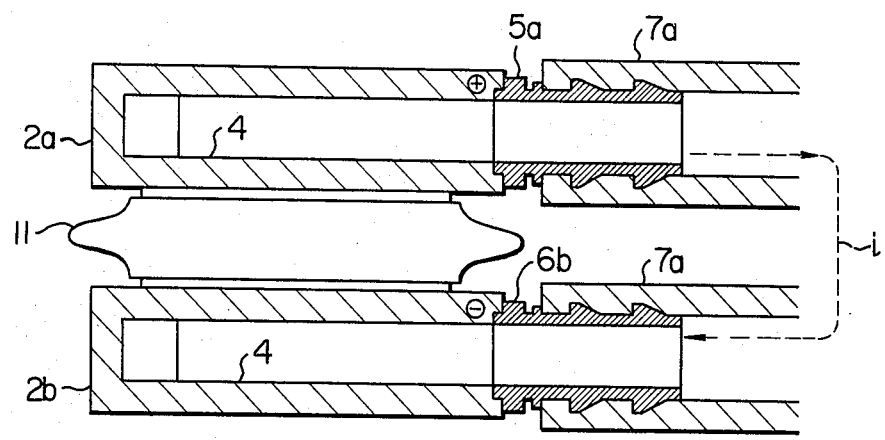
FIGS. 3A and 3B show an embodiment of the present invention applied to a thyristor which is a semiconductor element.
Figure 3B:
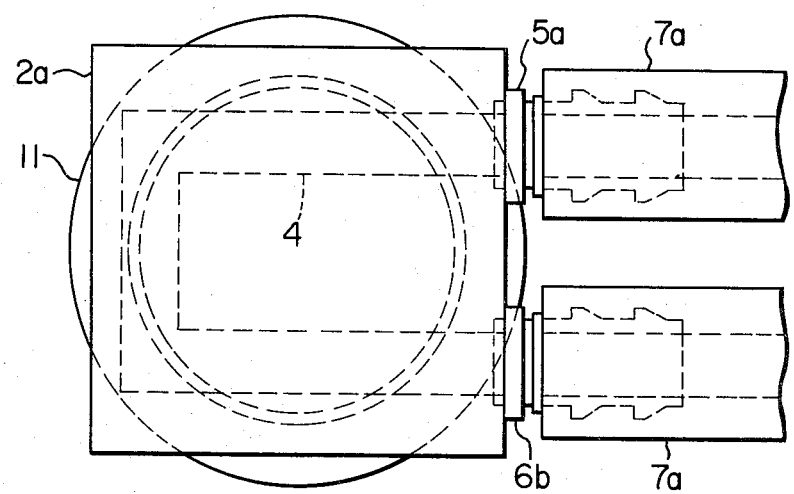

An example with electric circuit elements connected in series is shown in FIGS. 2A and 2B representing a side view and a plan view respectively. Water-cooling fins $2a$ to $2f$ are arranged in such a manner as to sandwich each of electric circuit elements $1a$ to $1e$ between them respectively. In FIG. 2A, the cooling water flows upward, and positive and negative electrodes are provided at upper and lower sides respectively. Since the electric circuit elements $1a$ to $1e$ are connected in series, an electric potential is caused between adjacent ones of the water-cooling fins $2a$ to $2f$. Between the water-cooling fins $2a$ and $2b$, for instance, the connector $5a$ forms a positive electrode and the connector $6b$ a negative electrode. Thus the current i flows in the water supply pipe $7a$ similarly to the case of FIG. 1. The manner in which this current flows is shown in FIGS. 3A and 3B illustrating a case of water-cooling a thyristor which is one of the electric circuit elements. FIG. 3A shows a side sectional view, with only the thyristor 11 shown as a side view, and FIG. 3B shows a plan view. The current i flows between the connectors $5a$ and $6b$, while very little metal is dissolved in the cooling water since the connectors $5a$ and $6b$ are made of SUS.

This is also the case between the water cooled fins $2b$ and $2c$, between $2c$ and $2d$, between $2d$ and $2e$ and between $2e$ and $2f$.

An embodiment of the present invention applied to a resistor element is shown in FIGS. 4A and 4B which are a side sectional view and a plan view respectively. As shown in the drawings, a resistor 21 is placed on the outer surface of the water-cooling fin 2 through an insulator 22, and the whole assembly is protected by a covering material 23. A positive electrode 24 and a negative electrode 25 are led out of the resistor 21. A conductor wire 26 is for applying a given potential of the resistor 21 to the water-cooling fin 2 in advance in order to secure the potential stability of the water-cooling fin 2. In FIGS. 3 and 4, the waterway 4 is connected with the water supply pipe 7 and water drain pipe 8 by the connectors 5 and 6 respectively as already described above. For the connection between the water-cooling fin 2 and each of the connectors 5 and 6 and the respective connections between the connectors 5 and 6 and the water supply pipe 7 and the water drain pipe 8, any means such as screwing, insertion or welding may be used.

An embodiment of the present invention as applied to a reactor element is shown in FIG. 5. As shown in the drawing, the insulating paper 32 is wound on the surface of a Cu pipe 31, and the resulting assembly is formed spirally to produce a reactor element. A positive terminal is taken out of one end of the pipe 31 and a negative terminal 34 out of the other end thereof. The waterway 4 is connected with the water supply pipe 7 and the water drain pipe 8 by the connector 5 and 6 respectively. As in the cases of FIGS. 3 and 4, any suitable means of connection may be used for the connection between the pipe 31 and the connectors 5 and 6 and for the respective connections between the connectors 5 and 6 and the water supply pipe 7 and the water drain pipe 8.

Figure 6:
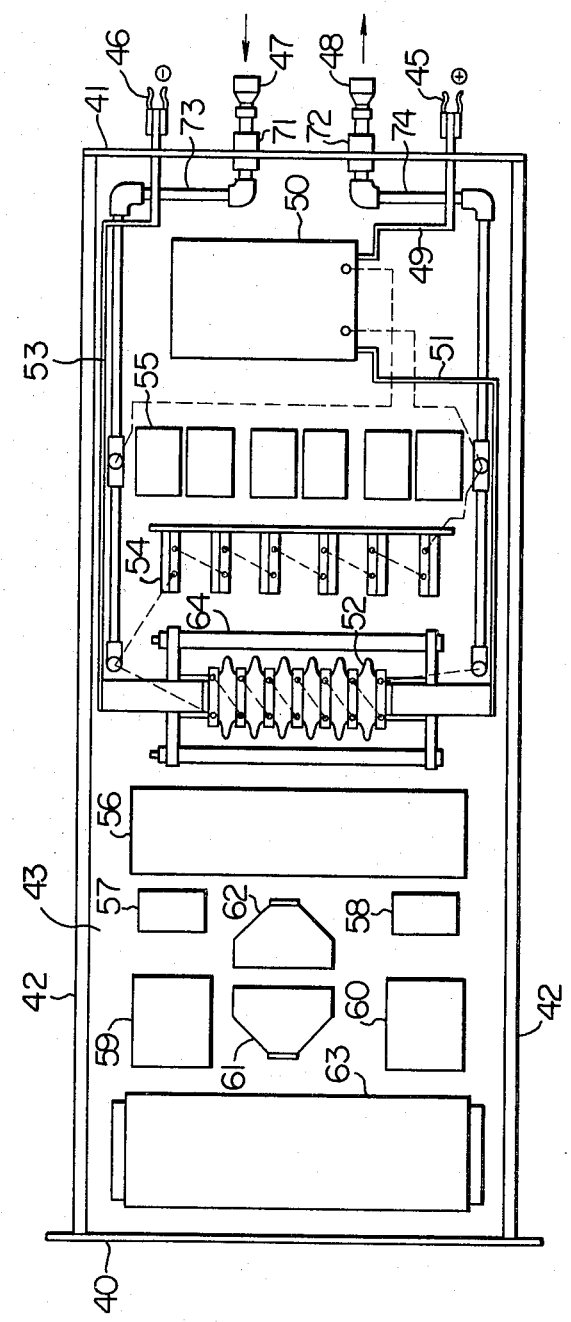
FIG. 6 is a diagram showing a further embodiment of the present invention applied to a tray for receiving electric circuit elements.

A plan view of a tray encasing electric circuit elements (not limited to a semiconductor element, a resistor or a reactor) is shown in FIG. 6. In this drawing, the tray is composed of a front board 40, a rear board 41, side boards 42 and a bottom board 43. Four terminals 45 to 48 are provided at the rear board 41. The outermost two terminals are the positive terminal 45 and the negative terminal 46 for the main circuit power supply, while the inside two terminals are the water supply pipe terminal 47 and the water drain pipe terminal 48, for the cooling water. The positive terminal 45 is connected via a conductor 49 to an end of an anode reactor 50. The other end of the reactor 50 is connected via a conductor 51 to the positive electrode of a thyristor stack 52 fixed by a fixing member 64. The negative electrode of the stack 52 is connected via a conductor 53 to the negative terminal 46. Resistors 54 and capacitors 55 are connected appropriately to the stack 52 through conductors not shown, thus forming a protective circuit for the thyristors.

The gate of each thyristor making up the stack 52 is impressed with a firing pulse via a conductor not shown from a firing system comprising a firing circuit 56, resistors 57, 58, capacitors 59, 60, pulse transformers 61, 62 and a pulse amplifier 63.

Those elements, among the above-mentioned electric circuit elements, which generate a comparatively large amount of heat in conduction or whose characteristics undergo a change with a small temperature change are cooled with water. In FIG. 6, for instance, the thyristors making up the stack 52, the anode reactor 50 and the resistors 54 making up the thyristor protective circuit are cooled with water.

The water supply terminal 47 provides an inlet of the cooling water and is connected with an insulating hose (not shown) outside of the tray. The terminal 47 is also connected via an SUS connector 71 to an insulating hose 73 inside of the tray.

The water drain pipe terminal 48 makes up an outlet of the cooling water and is connected to an insulating hose (not shown) outside of the tray. The terminal 48 is also connected via an SUS connector 71 to an insulating hose 74 inside of the tray.

The cooling water thus flows through a passage including the parts 47, 71, 73, 52 (54, 50), 74, 72 and 48 in that order, so that the thyristors, the resistors and the reactor are cooled substantially at a fixed temperature.

According to this embodiment, the connectors 71 and 72 are made of SUS but not of Cu or Al, so that the dissolution of metal into the cooling water from the connectors is very little.

Only the forward end of the connectors, not in its entirety, to be connected with each of the insulating water supply and drain pipes is made of an SUS material with a sufficient effect. Because the current is concentrated at the forward end of the connector, making only the forward end of the connector of SUS enables to reduce the amount of metal dissolved in the cooling water. Such embodiments are shown in FIGS. 7 to 10, in each of which figures (a) and (b) illustrate a side sectional view and a front view, of the connector, respectively.

Figure 7:
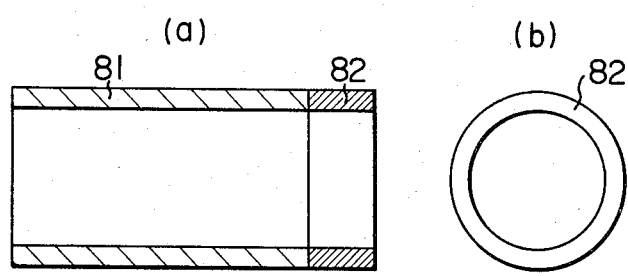
FIGS. 7 to 10 are diagrams showing modifications of a connector.

In FIG. 7, the CU connector 81 is provided with an SUS member 82 only at the forward end thereof.

Figure 8:
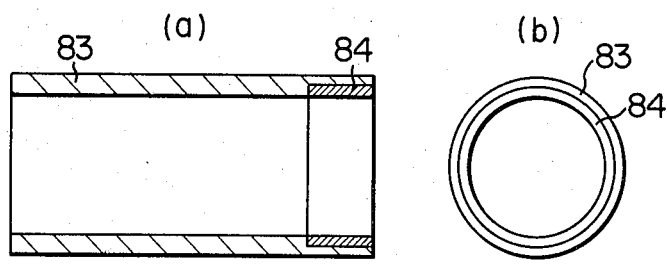

In FIG. 8, the Cu connector 83 is provided with an SUS member 84 only at the inside part of the forward end thereof.

Figure 9:
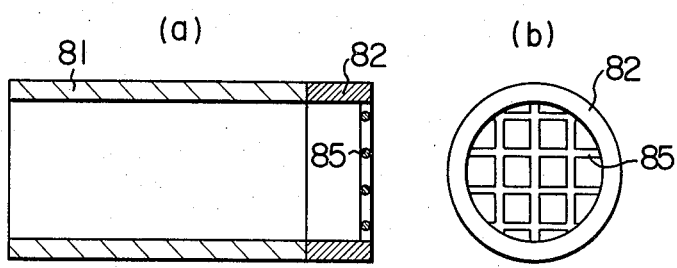
Figure 10:
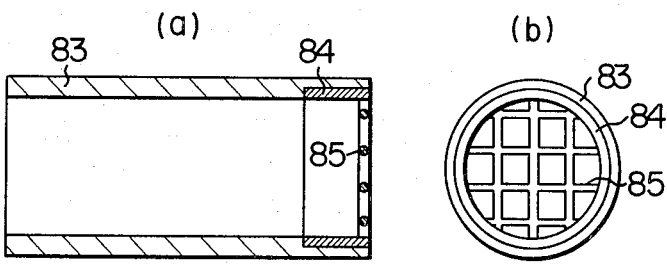

FIGS. 9 and 10 show further embodiments which are modifications of FIGS. 7 and 8 respectively and in each of which an SUS net 85 is stretched across the waterway inside of the member 84.

In FIGS. 7 and 8, most of the current flows through the SUS members 82 and 84 but part thereof may flow through the Cu connectors 81 and 83. As a result, a small amount of Cu is dissolved in the cooling water. In the cases of FIGS. 9 and 10 with the SUS net stretched across the waterway of the cooling water, however, substantially all the current flows through the SUS members 82, 84 and the SUS net 85 and little current flows in the Cu connector 83, so that substantially no Cu is dissolved in the cooling water.

In the embodiments described above, the whole or the forward end of the connector is made of an SUS material. As mentioned above, however, the present invention is not limited to SUS, but any alloy containing main components of Fe, Ni, and Cr may be used for the same purpose with equal effect.

What is claimed is:

1. A water cooling apparatus and an electric circuit element, comprising a waterway for allowing cooling water to pass therethrough, said waterway including:
   (a) an inner waterway portion so arranged as to directly cool the electric circuit element and defined by a metal which is apt to be dissolved in the cooling water at high electric field intensity;
   (b) an outer waterway portion connected to said inner waterway portion; and
   (c) a connecting waterway portion connecting said inner waterway portion with said outer waterway portion, said connecting waterway portion being formed in metal connector means, at least an inner surface of a connecting end portion of said connector means being made of an alloy containing Fe, Ni and Cr as its main component.

2. A water cooling apparatus according to claim 1, wherein said inner waterway portion is formed in a water-cooling fin made of a material comprising Cu.

3. A water cooling apparatus according to claim 1, wherein said inner waterway portion is formed in a water-cooling fin made of an alloy containing Cu as its main component.

4. A water cooling apparatus according to claim 1, wherein said inner waterway portion is formed in a water-cooling fin made of a material comprising Al.

5. A water cooling apparatus according to claim 1, wherein said inner waterway portion is formed in a water-cooling fin made of an alloy containing Al as its main component.

6. A water cooling apparatus according to claim 1, wherein said inner waterway portion is formed in a reactor element which is composed of a helically coiled pipe made of a material comprising Cu.

7. A water cooling apparatus according to claim 1, wherein said inner waterway portion is formed in a reactor element which is composed of a helically coiled pipe made of an alloy containing Cu as its main component.

8. A water cooling apparatus according to claim 1, wherein said inner waterway portion is formed in a reactor element which is composed of a helically coiled pipe made of a material comprising Al.

9. A water cooling apparatus according to claim 1, wherein said inner waterway portion is formed in a reactor element which is composed of a helically coiled pipe made of an alloy containing Al as its main component.

10. A water cooling apparatus according to claim 2, 3, 4, 5, 6, 7, 8 or 9, wherein the connecting end portion of said connector means is made of said alloy containing Fe, Ni and Cr as its main component.

11. A water cooling apparatus according to claim 2, 3, 4, 5, 6, 7, 8 or 9, wherein the whole body of said connector means is made of said alloy containing Fe, Ni and Cr as its component.

12. A water cooling apparatus according to claim 10, wherein a net made of an alloy containing Fe, Ni and Cr as its main component is stretched across said connecting waterway portion at the connecting end portion of said connector means.

13. A water cooling apparatus according to claim 11, wherein a net made of an alloy containing Fe, Ni and Cr as its main component is stretched across said connecting waterway portion at the connecting end portion of said connector means.

14. A water cooling apparatus and electric circuit elements, comprising:
   a tray encasing the electric circuit elements,
   metal connector means extending through a wall of said tray, and connecting an insulating hose disposed inside of said tray and an external insulating hose, at least an inner surface of a connecting end portion of said connector means being made of an alloy containing Fe, Ni and Cr as its main component.

15. A water cooling apparatus according to claim 14, wherein the connecting end portion of said connector means is made of said alloy containing Fe, Ni and Cr as its main component.

16. A water cooling apparatus according to claim 14, wherein the whole body of said connector means as made of said alloy containing Fe, Ni and Cr as its component.

17. A water cooling apparatus according to claim 14, 15 or 16, wherein a net made of an alloy containing Fe, Ni and Cr as its main component is stretched across a waterway portion at the connecting end portion of said connector means.

* * * * *